(12) United States Patent
Komiyama

(10) Patent No.: US 6,530,136 B1
(45) Date of Patent: Mar. 11, 2003

(54) METHOD FOR TRANSPORTING AND INSTALLING A SEMICONDUCTOR MANUFACTURING APPARATUS

(75) Inventor: Kiyoshi Komiyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/658,500

(22) Filed: Sep. 8, 2000

Related U.S. Application Data

(63) Continuation of application No. PCT/JP00/05465, filed on Aug. 15, 2000.

(30) Foreign Application Priority Data

Aug. 16, 1999 (JP) .......................................... 11-229806

(51) Int. Cl.⁷ ............................................... B23Q 3/00
(52) U.S. Cl. ........................... 29/464; 29/404; 29/423; 434/72
(58) Field of Search ......................... 29/404, 464, 722, 29/423; 52/27, 220.1; 434/72; 114/269

(56) References Cited

U.S. PATENT DOCUMENTS

| | | | | |
|---|---|---|---|---|
| 2,738,584 A | * | 3/1956 | Parker | 33/1 R |
| 2,907,122 A | * | 10/1959 | Dasey | 434/72 |
| 2,915,832 A | * | 12/1959 | Phillips | 434/72 |
| 2,933,829 A | * | 4/1960 | Kershaw et al. | 434/72 |
| 2,958,142 A | * | 11/1960 | Kershaw et al. | 434/72 |
| 3,419,970 A | * | 1/1969 | Wanderman | 434/72 |
| 4,095,350 A | * | 6/1978 | Wanderman | 434/72 |
| 4,261,952 A | * | 4/1981 | Szulinski | 422/159 |
| 5,303,466 A | * | 4/1994 | Ozai et al. | 29/837 |
| 5,768,773 A | * | 6/1998 | Fredell et al. | 29/832 |

FOREIGN PATENT DOCUMENTS

| | | | |
|---|---|---|---|
| JP | 04179113 A | 6/1992 | |
| JP | 06206149 A | 7/1994 | |
| JP | 10150064 A | 6/1998 | |
| JP | 11176712 A | 7/1999 | |
| JP | 11200651 A | 7/1999 | |
| JP | 411186118 | * 7/1999 | ........... H01L/21/00 |

* cited by examiner

Primary Examiner—Gregory M. Vidovich
Assistant Examiner—Essama Omgba
(74) Attorney, Agent, or Firm—Pillsbury Winthrop LLP

(57) ABSTRACT

An apparatus substitute is carried and installed in a clean room prior to installation of a semiconductor manufacturing apparatus. The apparatus substitute is composed of separate assembling boxes and is provided with tentative utility connection parts having the same specifications with respect to utility connection parts of the semiconductor manufacturing apparatus. Each of the utility connection parts is temporarily connected to one of a utility line via respective joint pipes. In the utility connection works or temporary connection, an apparatus installation position can be adjusted; a position or a size of a support plate of a floor can be corrected; a route of a utility line or a position can be corrected; or an inspection with respect to each utility line can be performed. After the completion of the inspection of the temporary connection, the utility lines are disconnected from the respective utility connection parts, and the apparatus substitute is divided into the individual boxes and removed from the clean room.

8 Claims, 13 Drawing Sheets

METHOD FOR TRANSPORTING AND INSTALLING A SEMICONDUCTOR MANUFACTURING APPARATUS

This application is a continuation of PCT/JP00/05465 filed Aug. 15, 2000.

TECHNICAL FIELD

The present invention relates to a method for carrying in and installing a semiconductor manufacturing apparatus in a clean room.

BACKGROUND ART

Apparatuses for manufacturing semiconductor devices are operated in a clean room in which less amount of dust exists. Generally, a device maker (semiconductor device manufacturer) places an order for development and fabrication of a semiconductor manufacturing apparatus with an apparatus maker (manufacturer of semiconductor manufacturing apparatuses). The apparatus maker carries the completed apparatus in a clean room of the semiconductor manufacturing plant or the research center of the device maker, and effects delivery of the apparatus to the device maker after checking the necessary performance. Various processes (operations) are performed according to predetermined procedures after the device maker decides the introduction of the semiconductor manufacturing apparatus and until the device maker starts the operation of the apparatus.

FIG. 1 shows a procedure of a conventional method for introducing or installing a semiconductor manufacturing apparatus. First, the specifications of the semiconductor manufacturing apparatus to be fabricated are decided by the device maker and the apparatus maker in consultation with each other (steps D1, C1, D2). At this time, the drawings of the apparatus are also made (step C2). Next, the device maker places an order for the apparatus upon decision of the installation position of the apparatus (steps D3 and D4). Upon receipt of the order, the apparatus maker starts fabrication of the apparatus in accordance with the specifications and the drawings (step C3). After the order of the apparatus is placed, the device maker arranges with the associated suppliers with respect to engineering works for installing equipments of various utility lines, such as an electricity line, a gas line, an exhaust line, a vacuum line or a cooling water line, around the installation position of the apparatus (step D5). Then, after the completion of the fabrication of the apparatus by the apparatus maker, the device maker attends to the performance inspection (step D6).

Generally, the semiconductor manufacturing apparatus takes a form of a system in which a processing apparatus having a process chamber (vacuum chamber) for performing a step of a semiconductor manufacturing process is provided as a central core and peripheral devices, such as a target object transportation device or a gas supply device, are provided around the central core. The processing apparatus and the peripheral devices are fabricated as individual units so as to constitute a separable combination system. In the above-mentioned attendance inspection, the system is temporarily constructed by assembling all of the related units so as to test the basic performance as a whole system.

After confirmation and approval are obtained with respect to the performance of the apparatus in the attendance inspection, the apparatus maker settles a schedule for carrying the apparatus in the device maker's site (step C4). Then, in order to facilitate the carry-in, the apparatus (system) is disassembled into individual units (step C5).

On the other hand, on the device maker side, installation works of the utility equipments are performed in a clean room (step D7). In the utility construction, apparatus carry-in route and apparatus installation position are decided in accordance with the drawings of the apparatus, and marking is provided to the floor of the decided apparatus installation position. Then, the utility equipments are established up to the apparatus installation position. That is, various utility lines (pipe, cable) are drawn to positions under the ceiling or above the grating floor in the vicinity of the apparatus installation position. The utility installation works are completed before the date of installation of the apparatus (step D8).

The apparatus maker separates or divides the apparatus into individual units and carries the individual units in the clean room of the device maker (step C6), and the device maker gathers the individual units at the apparatus installation position so as to assemble the apparatus (step C7). After assembling the apparatus, the device maker performs utility connection works so as to connect each utility connection part of the apparatus to the respective utility line (step D9). It is normal that such works are performed, after making executing drawings based on the assembled actual apparatus, on an individual utility line basis in accordance with the execution drawings, and, thus, a considerable time period is required. During such a time period, the apparatus maker is on standby (step C8).

After all of the utility lines are connected (step D10), the apparatus maker performs the checking of the performance of the apparatus, that is, a startup of the apparatus, with the attendance of the device maker (step C9). After the startup, the apparatus is transferred from the apparatus maker to the device maker.

As mentioned above, according to the conventional procedures for carrying-in and installing a semiconductor manufacturing apparatus, the utility works performed prior to carrying the apparatus in the clean room are based on the drawings of the apparatus. Accordingly, the utility lines must be ended at positions near the apparatus installation position. Then, after the apparatus is carried in and assembled, the utility line connection works are performed with respect to each utility connection part of the apparatus. Accordingly, the startup of the apparatus is delayed for the period needed to the utility line connection works after the carry-in and installation of the apparatus.

However, it is a device maker's desire to start the operation of the apparatus as early as possible. Additionally, the apparatus maker also desires to complete the delivery by starting the apparatus as early as possible after the carry-in and installation of the apparatus. The period for the utility line connection works is an undesired standby period although it is necessary for both parties. Additionally, the system of the semiconductor manufacturing apparatus tends to be large-scaled, and the number of kinds of utility connection parts increases as the scale of the apparatus system increases. Accordingly, a time (period for works) necessary for the utility line connection works is increased, which results in a further increase in the standby period.

SUMMARY OF THE INVENTION

It is an object of the present invention to provide an improved and useful method of carry-in and installation of a semiconductor manufacturing apparatus in which the above-mentioned problems are eliminated.

A more specific object of the present invention is to provide a method of carry-in and installation of a semiconductor manufacturing apparatus, which method reduces a time period from the carry-in of the apparatus to the completion of the connection of the utility lines so as to hasten the startup of the apparatus or the start time of operation of the apparatus.

Another object of the present invention is to provide an apparatus substitute suitable for executing the method of carry-in and installation according to the present invention.

In order to achieve the above-mentioned objects, there is provided according to one aspect of the present invention a method for carrying in and installing a semiconductor manufacturing apparatus in a clean room, the method characterized by:

preparing an apparatus substitute having tentative utility connection parts corresponding to utility connection parts of the semiconductor manufacturing apparatus, the tentative utility connection parts being positioned at substantially the same positions as that of the utility connection parts of the semiconductor manufacturing apparatus;

carrying the apparatus substitute in the clean room and arranging apparatus substitute at a predetermined apparatus installation position;

providing utility lines to the tentative utility connection parts of the apparatus substitute positioned at the apparatus installation position;

removing the apparatus substitute from the clean room;

carrying the semiconductor manufacturing apparatus in the clean room and installing the semiconductor manufacturing apparatus at the apparatus installation position after the apparatus substitute is removed; and connecting said utility lines to the utility connection parts of the semiconductor manufacturing apparatus carried in the clean room.

According to the above-mentioned invention, prior to the carry in and installation of the semiconductor manufacturing apparatus in the clean room, the apparatus substitute provided with the tentative utility connection parts at the same position as that of the semiconductor manufacturing apparatus is carried in the clean room and is installed at the position at which a real semiconductor manufacturing apparatus will be installed, and utility lines are provided up to the position of the temporary connection of the tentative utility connection parts of the apparatus substitute. Then, the semiconductor manufacturing apparatus is carried and installed in the clean room after the apparatus substitute is removed, and, thereby, the utility lines can be immediately connected to the utility connection parts of the semiconductor manufacturing apparatus without works for providing the utility lines, and the utility can be supplied. Accordingly, the standby period with respect to the connection of utility lines after the carry-in and installation of the semiconductor manufacturing apparatus can be eliminated, and the operation of the semiconductor manufacturing apparatus can be started early.

In the present invention, the apparatus substitute may have the same outside dimension with the semiconductor manufacturing apparatus. In this case, the operation for carrying and installing the real semiconductor manufacturing apparatus can be simulated by carrying and installing the apparatus substitute in the clean room. Accordingly, the operation for carrying and installing the real semiconductor manufacturing apparatus can be smoothly performed without problems. For example, a carry-in route for carrying the semiconductor manufacturing apparatus in the clean room may be determined based on a carry-in route for carrying the apparatus substitute in the clean room.

Additionally, in a case in which when the semiconductor manufacturing apparatus comprises a plurality of units that are separately combined with each other, the method may include: separating the apparatus substitute into a plurality of units, at least a part of the units of the apparatus substitute corresponds to the units of the semiconductor manufacturing apparatus; carrying the units of the apparatus substitute in the clean room; and assembling the units of the apparatus substitute carried in the clean room so as to restore the apparatus substitute.

Additionally, each of the tentative utility connection parts of the apparatus substitute may be based on the same connection specifications as the respective one of the utility connection parts of the semiconductor manufacturing apparatus, and the step of providing the utility lines may include disconnecting the utility line after tentatively connecting the utility lines to the tentative utility connection parts. That is, by previously performing the inspection with respect to the utility lines after the temporary connection is performed, the inspection can be simplified when the real semiconductor manufacturing apparatus is installed.

Additionally, by providing a caster and height adjusting tool which is substantially the same as a caster and height adjusting tool provided to the semiconductor manufacturing apparatus, the apparatus substitute can be carried and installed in the clean room through a route along which the apparatus substitute is carried and installed in the clean room.

Additionally, when the clean room has positions at which a plurality of the semiconductor manufacturing apparatuses are installed, the step for providing the utility lines may be repeated a plurality of times.

Additionally, according to another aspect of the present invention a method for carrying in and installing a semiconductor manufacturing apparatus in a clean room, the method characterized by:

preparing an apparatus substitute having utility connection parts of said semiconductor manufacturing apparatus positioned at substantially the same positions as that of the utility connection parts of the semiconductor manufacturing apparatus;

carrying the apparatus substitute in the clean room and arranging the apparatus substitute at a predetermined apparatus installation position;

connecting the utility connection parts of said apparatus substitute positioned at the apparatus installation position to the utility lines;

disconnecting the utility connection parts from the apparatus substitute and removing said apparatus substitute from clean room;

carrying the semiconductor manufacturing apparatus in the clean room and installing the semiconductor manufacturing apparatus at the apparatus installation position after the apparatus substitute is removed; and connecting the utility lines to the semiconductor manufacturing apparatus carried in the clean room;

According to the above-mentioned invention, prior to the carry in and installation of the semiconductor manufacturing apparatus in the clean room, the apparatus substitute provided with the utility connection parts at the same position as that of the semiconductor manufacturing apparatus is carried in the clean room and is installed at the position at which a real semiconductor manufacturing apparatus will be installed, and utility lines are connected to the utility connection parts of the apparatus substitute. Then, the semiconductor manufacturing apparatus is carried and installed in the clean room after the apparatus substitute is removed with the utility connection parts being remained, and, thereby, the utility lines can be immediately connected to the utility connection parts of the semiconductor manufacturing apparatus without works for providing the utility lines, and the utility can be supplied. Accordingly, the standby period with respect to the connection of utility lines after the carry-in and installation of the semiconductor manufacturing apparatus can be eliminated, and the operation of the semiconductor manufacturing apparatus can be stated early.

Additionally, there is provided according to the present invention an apparatus substitute, which can be used in the above-mentioned methods for carrying and installing a semiconductor manufacturing apparatus.

BEST MODE FOR CARRYING OUT THE INVENTION

A description will now be given, with reference to the accompanying drawings, of a first embodiment of the present invention.

Figure 1:
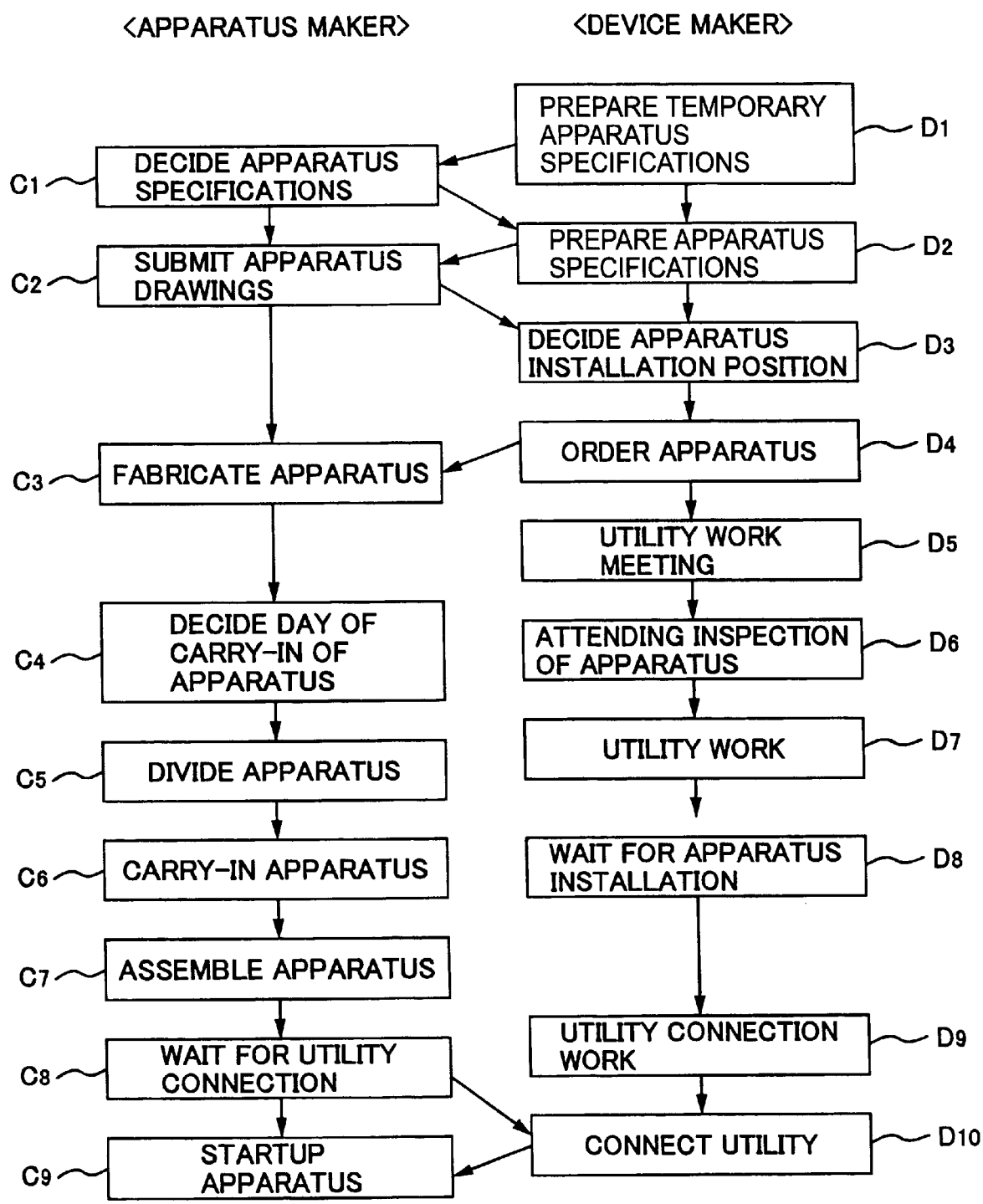
FIG. 1 As a flowchart showing procedures of a conventional method of carry-in and installation of a semiconductor manufacturing apparatus.
Figure 2:
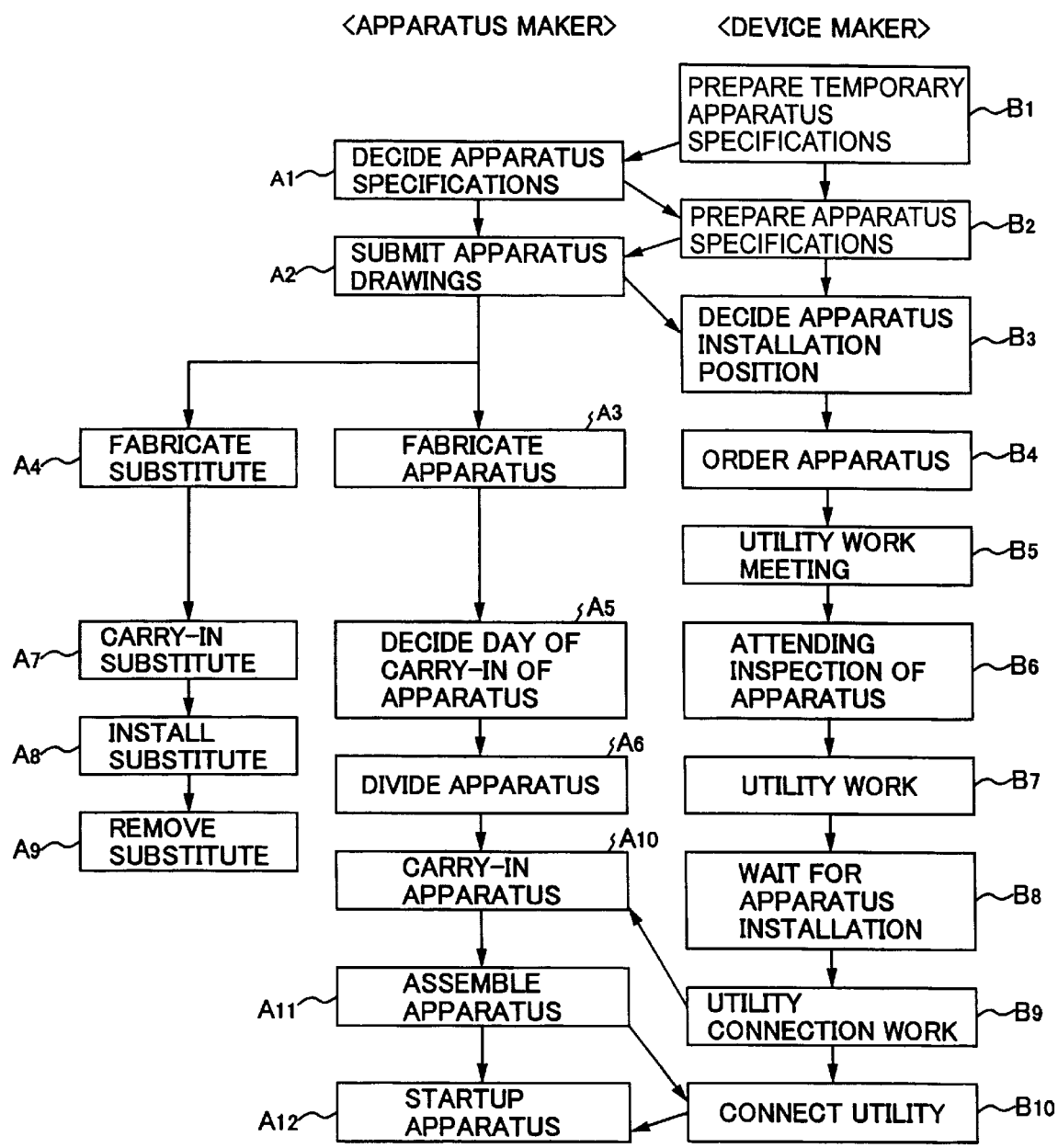
FIG. 2 is a flowchart showing procedures of a method of carry-in and installation of a semiconductor manufacturing apparatus which method is according to a first embodiment of the present invention.

FIG. 2 shows procedures of carry-in and installation of a semiconductor manufacturing apparatus according to the present invention. In a device maker, preparation of the tentative specifications to the utility works (steps B1 to B7) are substantially the same with the corresponding procedures (steps D1–D7) of the conventional method (FIG. 1). Also in the apparatus maker, the steps (steps A1–A3, A5–A6, A10–A11) from the decision of the apparatus specification to the assembly of the apparatus are the same as that of the corresponding conventional steps (steps C1–C7), and descriptions thereof will be omitted.

In the method of the present embodiment, the point different from the conventional method is the procedures (steps B7–B10) after the utility works in the device maker, and the steps (steps A4, A7–A9) with respect to the box described later are newly provided concurrently with the steps from the fabrication to the carry-in of the apparatus in the apparatus maker.

Figure 3:
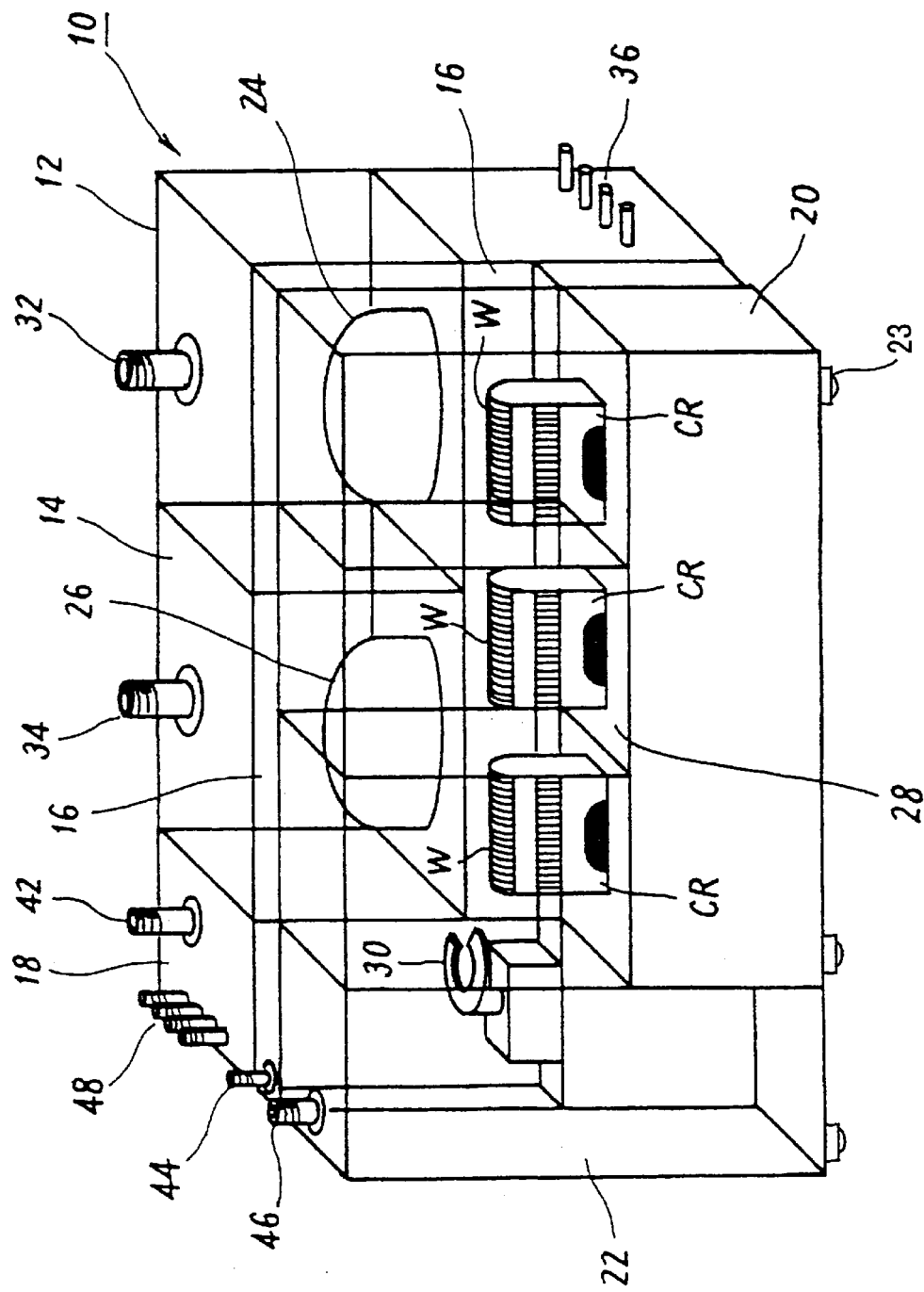
FIG. 3 is a perspective view of a semiconductor manufacturing apparatus to which the carry-in and installation method according to the first embodiment of the present invention is applied.

FIG. 3 shows the semiconductor manufacturing apparatus 10 to which the method for carrying in and installing a semiconductor apparatus according to first embodiment of the present invention is applied. The semiconductor manufacturing apparatus 10 comprises processing units 12 and 14, a transfer unit 16, a gas control unit 18, a cassette station unit 20 and a utility unit 22. These units are connected to each other so as to constitute one system. The processing units 12, 14 are provided with vacuum chambers 24 and 26, respectively. In the vacuum chamber 22 and 26, a process such as an etching process is performed on an object to be processed such as a semiconductor wafer W under a predetermined depressurized condition in accordance with a wafer-fed method.

In the cassette station unit 20, there is provided a cassette placement table 28 on which a plurality of cassettes CR (for example, 3 cassettes) can be placed, each of the cassettes can accommodate a predetermined number of semiconductor wafers W (for example, 25 wafers). An opening (not shown in the figure) for inlet and outlet of the cassette is formed on a front-side housing wall of the unit 20, and an opening (not shown in the figure) for inlet and outlet of the wafer is formed on a rear-side housing wall.

The transfer unit 16 is positioned between the cassette station unit 20 and the processing units 12 and 14. In the transfer unit 16, there is provided a transfer apparatus 30 for transferring the semiconductor wafer W within the system, especially, between the units 20, 12 and 14. In the gas control unit 18, there are provided a control valve and flow controller (not shown in the figure) of a gas control system which supplies a material gas to the vacuum chamber 24 and 26 of the processing units 12 and 14.

In the utility unit 22, circuits, switches and an operational panel (not shown in the figure) for supplying an electric power or control signals are provided in the utility unit 22.

Each of the units 12–20 has an individual housing structure, and utility connection parts are provided at predetermined positions of each of the units, the utility connection parts for connecting each part in the unit to predetermined utility lines (an electric system, a gas system, a plant exhaust system, a vacuum system, a cooling system, etc.). More specifically, pipe connection ports 32 and 34 are provided on the top surfaces of the housings of the processing units 12 and 14, respectively, so as to connect the inner spaces of the units to an air conditioning system. Additionally, pipe connection ports 36 are provided on a side of the housing of the processing unit 12 for connecting a water cooling temperature control mechanism in the units 12 and 14 to an external water supply system. Further, pipe connection ports 38 and 40 (although not show in the figure, only reference numerals are indicated for the sake of convenience) are provided on rear sides of the housings of the processing units 12 and 14, respectively, for connecting the process spaces in the vacuum chambers 24 and 26 to an external vacuum exhaust system.

Pipe connection ports 42, 44 and 46 are provided on the upper surfaces of the transfer unit 16, gas control unit 18 and the utility unit 22, respectively, for connecting the spaces in the units to an external air conditioning system. Additionally, a pipe connection port 48 is provided on an upper surface of the gas control unit 16 so as to connect a gas supply mechanism in the unit 16 to an external material gas supply system. Further, a pipe connection port 49 (although not show in the figure, only reference numerals are indicated for the sake of convenience) is provided on a side of the housing of the gas control unit 16 so as to connect the inner space of the unit 16 to a heat exhaust system.

One of the units, especially, the utility unit 22, is provided with connectors or terminals (not shown in the figure) for electric connection. Generally, utility connection works for an electric system are easy since electric cables for transmitting electric utility (power, signal, etc.) have a freedom in their length and arrangement. On the other hand, arrangement of a pipe line used for supply/exhaust of fluid utility (gas, vacuum, water cooling, etc.) is relatively complex since the pipe line is generally made of a rigid material such as a stainless steel, and a high accuracy is required in its size.

Additionally, casters (wheels) for movement and height adjusters 23 for height adjustment are mounted at predetermined positions on the bottom surface of each of the units 12–22.

In the present embodiment, the apparatus maker fabricates (step A3) the semiconductor manufacturing apparatus 10 in accordance with apparatus drawings (step A2) while producing (step A4) an apparatus substitute by the same apparatus drawings (step A2).

Figure 4:
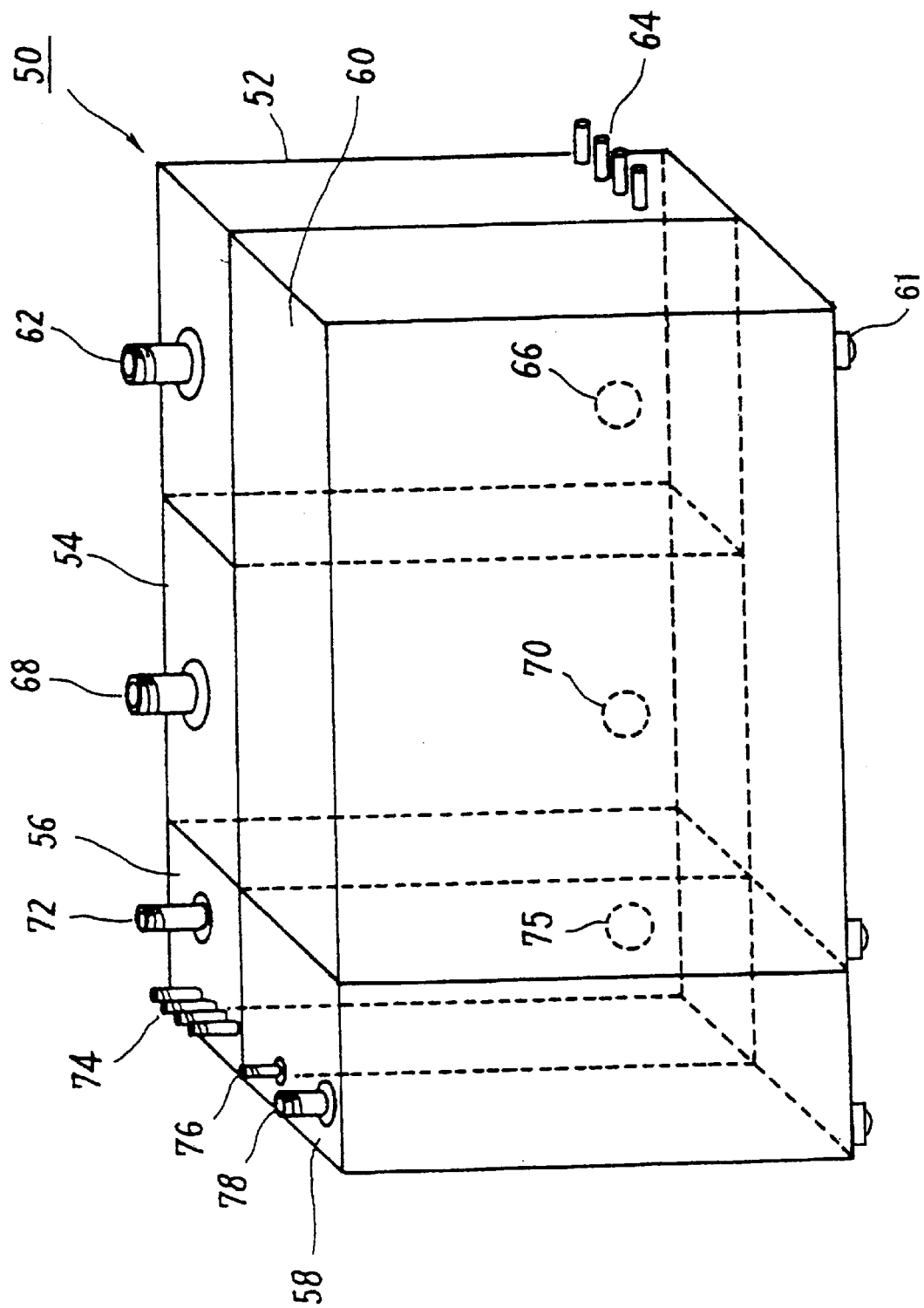
FIG. 4 is a perspective view of an apparatus substitute for the semiconductor manufacturing apparatus shown in FIG. 3.

FIG. 4 shows a structure of the apparatus substitute 50 in the present embodiment. The apparatus substitute 50 (may be referred to as a jig) is constituted by five unit substitute boxes 52–60 combined with each other, and serves as a substitution system for the above-mentioned semiconductor manufacturing apparatus 10.

Among the unit substitute boxes 52–60, the box 52 corresponds to the above-mentioned processing unit 12, and has a length, width and height substantially the same as the unit 12. Additionally, the box 52 has tentative utility connection parts 62, 64 and 66 having the same connection specifications as the utility connection parts 32, 36 and 38 of the processing unit 12, the tentative utility connection parts 62, 64 and 66 being located at substantially the same positions as the utility connection parts 32, 36 and 38 of the processing unit 12.

The box 54 corresponds to the processing unit 14, and has a length, width and height substantially the same as the unit 14. Additionally, the box 54 has tentative utility connection parts 68 and 70 having the same connection specifications as the utility connection parts 34 and 40 of the processing unit 14, the tentative utility connection parts 68 and 79 being located at substantially the same positions as the utility connection parts 34 and 40 of the processing unit 14. The box 56 corresponds to the gas control unit 18, and has a length, width and height substantially the same as the unit 18. Additionally, the box 56 has tentative utility connection parts 72, 74 and 75 having the same connection specifications as the utility connection parts 42, 48 and 49 of the gas control unit 16, the tentative utility connection parts 72, 74 and 75 being located at substantially the same positions as the utility connection parts 42,48 and 49 of the gas control unit 18.

The box 58 corresponds to a space defined by the utility unit and a part of the transfer unit. The box 58 has tentative utility connection parts 76 and 78 having the same connection specifications as the utility connection parts 44 and 46 of the units 22 and 16, the tentative utility connection parts 76 and 78 being located at substantially the same positions as the utility connection parts 44 and 46 of the units 22 and 16. The box 60 corresponds to the space of the remaining part of the transfer unit 16. As mentioned above, in the present embodiment, the two boxes 58 and 60 correspond to the three units including the transfer unit 16, the cassette station unit 20 and the utility unit 22. However, the units and the boxes may strictly correspond on one-to-one basis.

Each of the boxes 52–60 may be made of a material having a suitable workability such as a metal plate such as stainless steel or a resin such as plastics or wood, and an interior of each of the boxes can be empty. Additionally, the specifications of each of the utility connection parts provided to the boxes other than the connection specifications (configuration and structure) can be arbitrarily selected, that is, for example, the material can be arbitrarily selected. Caster and adjusters 61 are mounted on the bottom surfaces of the boxes 52–60 substantially the same positions as the caster and adjusters 23 mounted on the bottom surfaces of units 12–22 of the semiconductor manufacturing apparatus 10, the caster and adjusters 61 having the same configuration and function as the caster and adjusters 23. The thus-structured apparatus substitute 50 can be fabricated at a cost much lower than the cost of the real apparatus 10, and can be completed within a period shorter than that of the apparatus 10.

On the other hand, in the device maker, utility equipment and lines are started (step B7) at an appropriate time on the assumption that the apparatus substitute 50 is installed at the apparatus installation position in the clean room.

Figure 5:
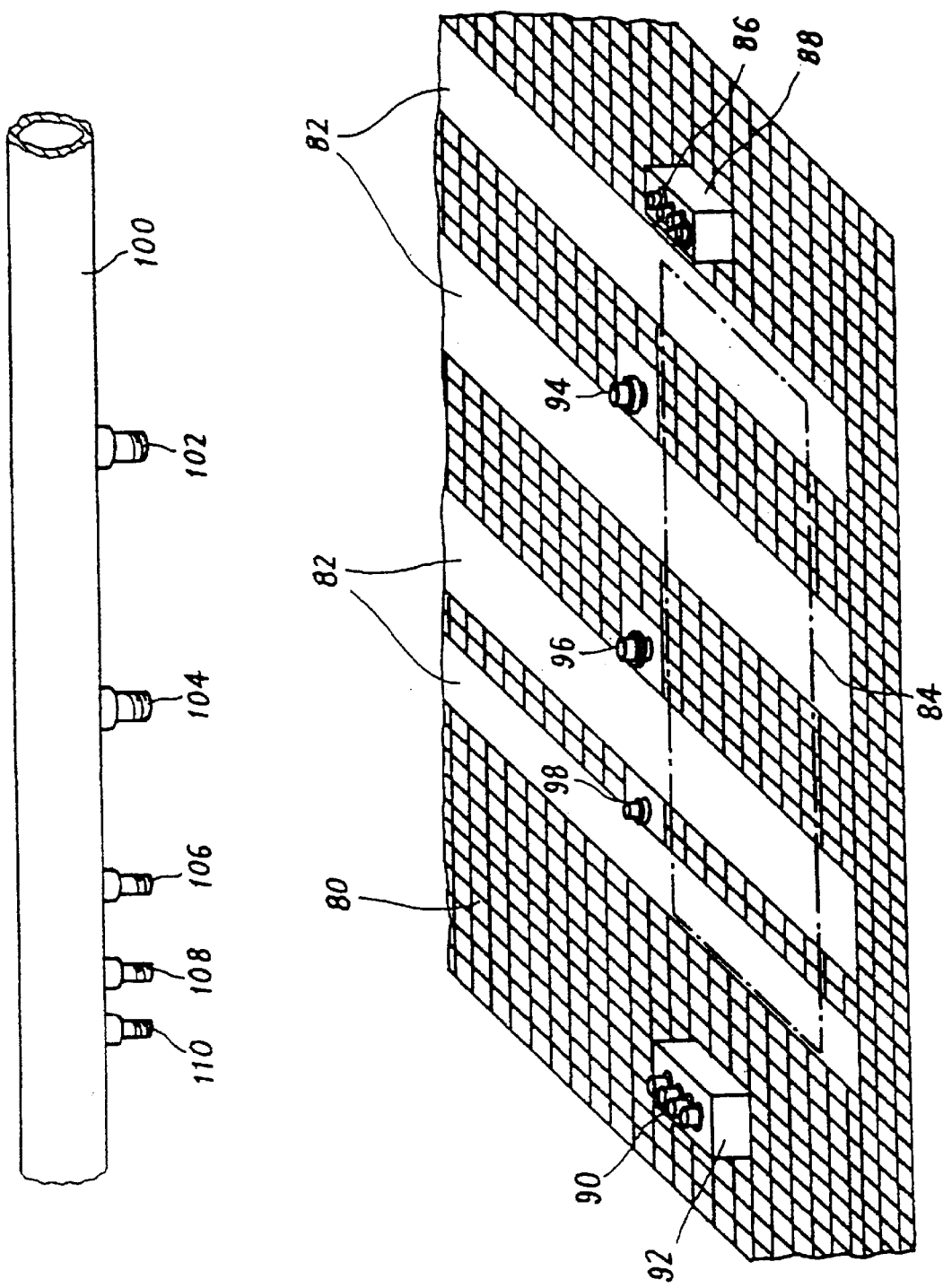
FIG. 5 is a perspective view showing the contents of execution of utility works in a clean room.

For example, as shown in FIG. 5, the utility lines may be provided up to positions near the apparatus installation position in the clean room before the apparatus substitute 50 is carried in the clean room. The utility works up to this stage can be executed based on the apparatus drawings.

In FIG. 5, a large part of the floor of the clean room is a grating floor 80 which has many holes (through holes) arranged in a grid pattern. Air supplied from the HEPA filter on the ceiling by a down flow passes through the holes of the grating floor 80 and goes to under floor. Portions of the floor on which the semiconductor manufacturing apparatus 10 (more accurately, the casters of the apparatus) moves and installed are provided with rigid support plates 82 having a high strength instead of the grating floor 80.

In the present embodiment, a section 84 indicted by single dashed chain lines in FIG. 5 is the apparatus installation position. Various utility lines are provided up to positions near the apparatus installation position 84 on the floor surface and the overhead location. More specifically, a line relay box 88 is provided on the floor surface of one side of the apparatus installation position 84, and lines (pipes) 86 of the water supply and drainage system are raised from the under floor and are extended from an upper surface of the line relay box 88. Various valves measuring instruments and valves are provided in the line relay box 88. A line relay box 92 is provided on the floor surface of opposite side of the lines 86 of the water supply and drainage system with respect to the apparatus installation position 84. Lines (pipes) 90 of the gas supply system are raised from the under floor and are extended from an upper surface of the line relay box 92. Various valves measuring instruments and valves are also provided in the line relay box 92. Lines (pipes) 94 and 96 of the vacuum exhaust system and lines (pipes) 98 of the heat exhaust system are raised from the under floor to the rear side of the apparatus installation position 84. A line (duct) 100 of the air conditioning system is provided parallel to the floor surface above the apparatus installation position 84. Connection ports 102–110 are provided to appropriate positions of the duct 100.

When the above-mentioned utility works are ended on the device maker side (or may be during the works), the apparatus maker divides or separates the apparatus substitute 50 into the individual boxes 52–60, and carry the units in the clean room of the device maker (step A7). At the time of the carry-in, an optimum transportation route up to the apparatus installation position 84 is decided or confirmed for each of the boxes 52–60 in response to the layout of the clean room. Then, all of the boxes 52–60 are arranged in the apparatus installation position 84, and the apparatus substitute 50 is assembled by combining the boxes 52–60 (step A8).

Figure 6:
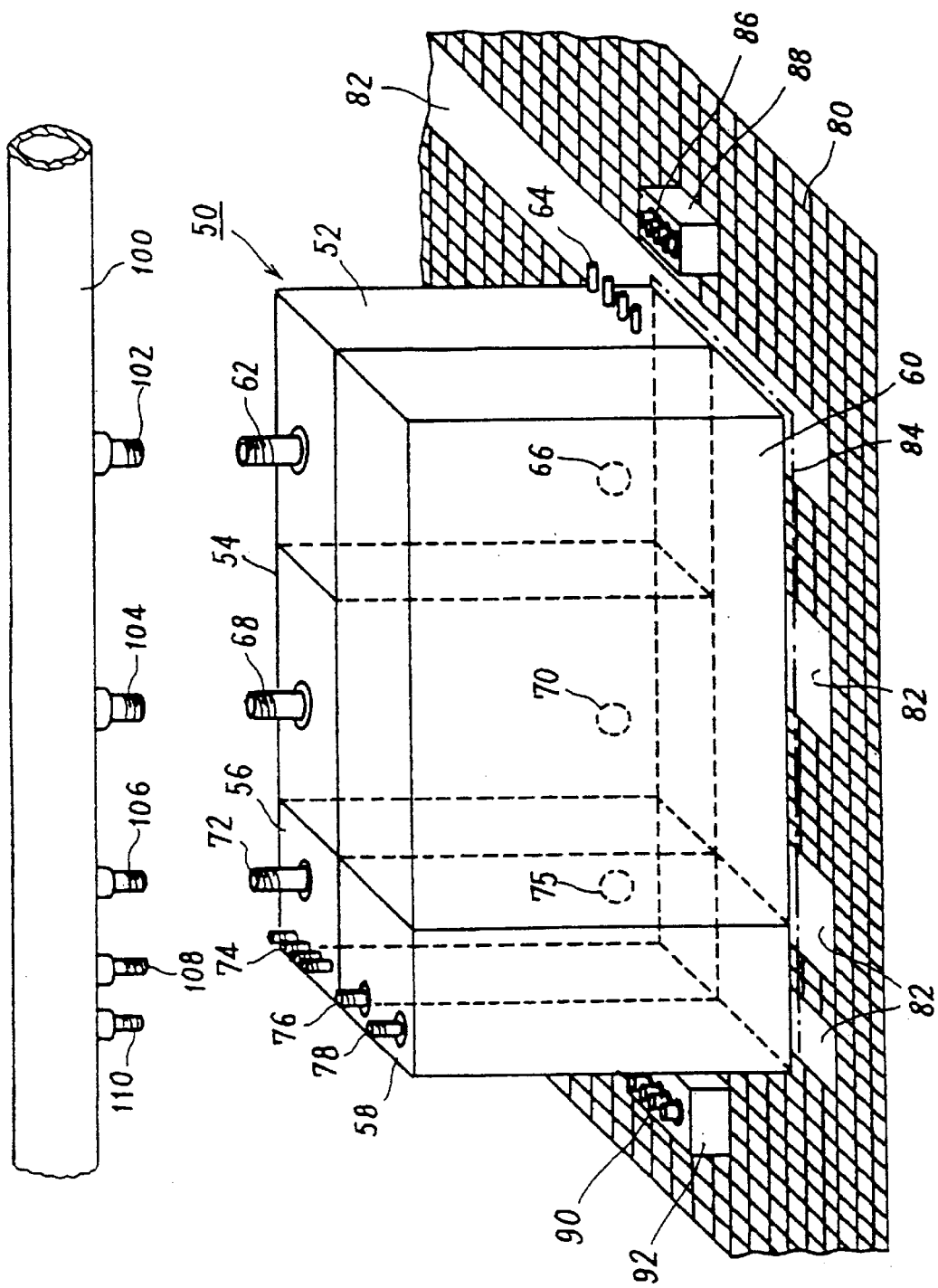
FIG. 6 is a perspective view showing a state of arrangement of an assembled apparatus substitute at an apparatus installation position in the clean room.

FIG. 6 shows the apparatus substitute 50 located in the apparatus installation position 84. In the state shown in FIG. 6, the tentative utility connection parts 62–78 have not yet connected to the respective utility lines. The casters of the apparatus substitute 50 are used for transportation up to the apparatus installation position 84, and the apparatus substitute 50 is fixed at the apparatus installation position 84 by adjusting the adjuster.

Thereafter, in the state shown in FIG. 6, utility connection works are performed (step B8) for connecting the tentative utility connection parts 62–78 of the apparatus substitute 50 to the respective utility lines at the device maker.

Figure 7:
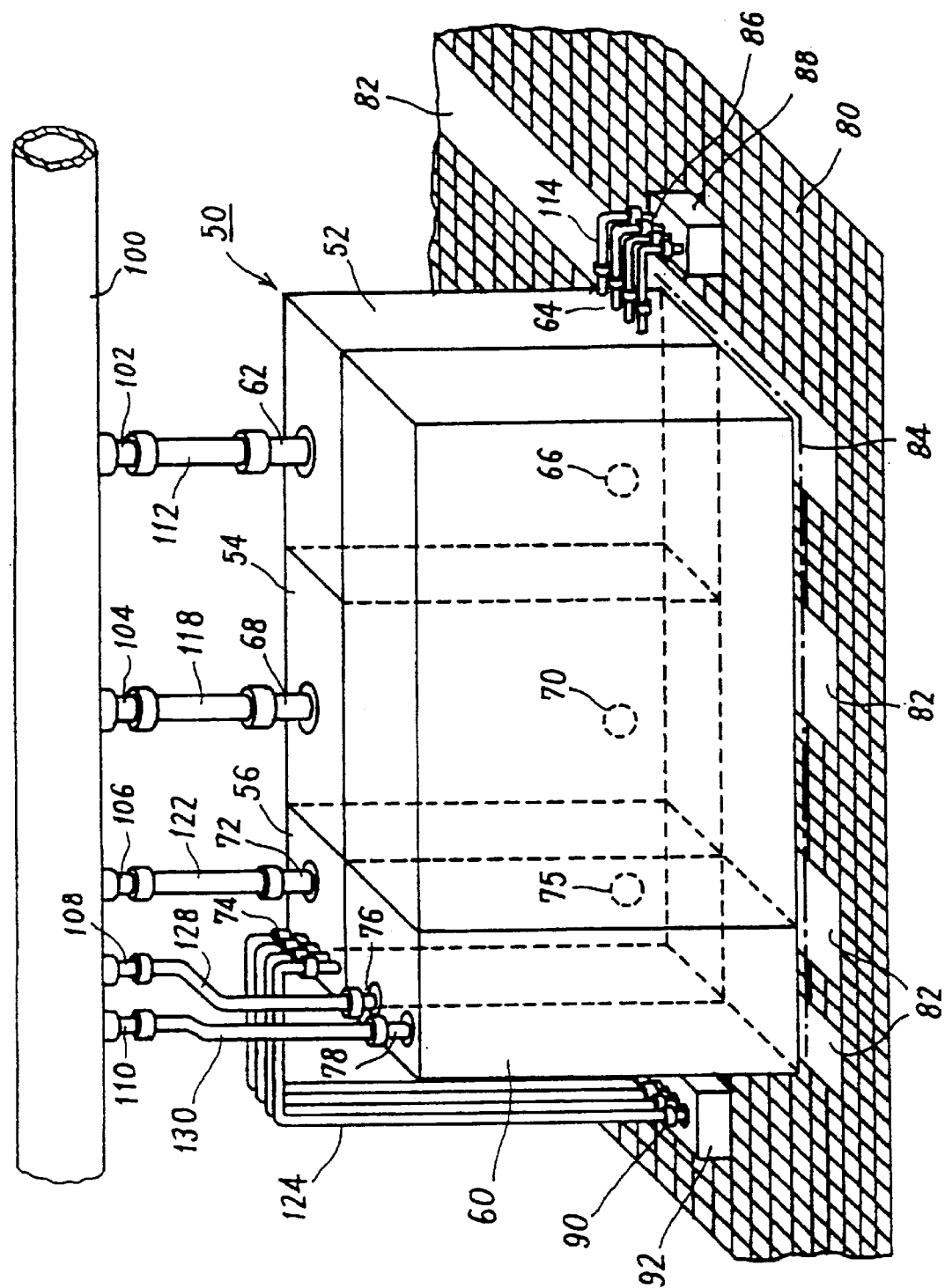
FIG. 7 is a perspective view showing the contents of execution of utility works with respect to the apparatus substitute.
Figure 8:
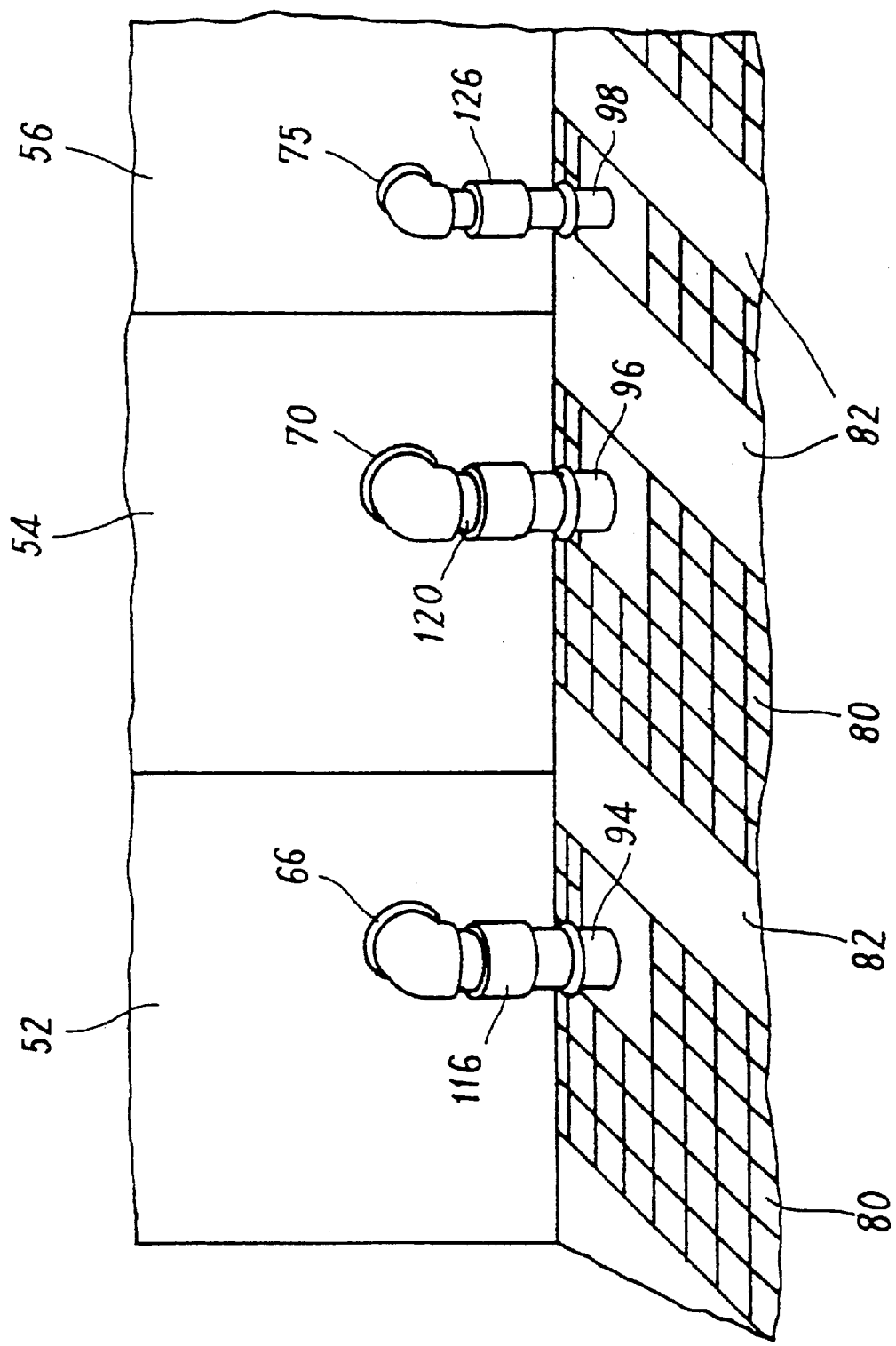
FIG. 8 is a partial perspective view showing the contents of execution of utility works with respect to the apparatus substitute.

FIG. 7 and FIG. 8 show examples of the utility connection works. The tentative utility connection part 62 provided on the upper surface of the box 52 is temporarily connected to the connection port 102 provided on the duct 100 of the air conditioning system via a joint pipe 112. The tentative utility connection part 64 provided on the side surface of the box 52 is temporarily connected to the pipe 86 of the water supply and drainage system via a joint pipe 114. The tentative utility connection part 66 provided on the rear surface of the box 52 is temporarily connected to the pipe 94 of the vacuum exhaust system via a joint pipe 116.

The tentative utility connection part 68 provided on the upper surface of the box 54 is temporarily connected to the connection port 104 provided on the duct 100 of the air conditioning system via a joint pipe 118. The tentative utility connection part 70 provided on the rear surface of the box 54 is temporarily connected to the pipe 96 of the vacuum exhaust system via a joint pipe 120.

The tentative utility connection part 72 provided on the upper surface of the box 56 is temporarily connected to the connection port 106 provided on the duct 100 of the air conditioning system via a joint pipe 122. Additionally, the tentative utility connection parts 74 of the upper surface of the box 56 are temporarily connected to the pipes 90 of the gas supply system via joint pipes 124. The tentative utility connection part 75 provided on the rear surface of the box 56 is temporarily connected to the pipe 98 of the heat exhaust system via a joint pipe 126.

The tentative utility connection parts 76 and 78 provided on the upper surface of the box 60 are temporarily connected to the respective connection ports 108 and 110 provided on the duct 100 of the air conditioning system via joint pipes 128 and 130, respectively.

In the utility connection works, the apparatus installation position 84 can be moved, if necessary. Additionally, the positions of the support plates 82 can be changed in response to the positions of the casters or adjusters of the apparatus substitute 50 in the apparatus installation position 84. Further, the routes or setting positions of the utility lines can be changed in response to the positions of the utility connection parts.

Additionally, the necessary inspection can be performed with respect to each utility line in a state in which each utility line is connected to the respective one of the utility connection parts of the apparatus substitute 50. For example, in the gas supply line, a due point inspection, a particle inspection, an airtightness inspection and pressure withstand inspection can be performed (completed).

After the above-mentioned temporary connection is completed, the joint pipes 112–130 are disconnected from the respective tentative utility connection parts 62–78, and the apparatus maker divides the apparatus substitute 50 into the individual boxes 52–60 and removes the boxes from the clean room (step A9). The removal is completed before the day of carry-in of the semiconductor manufacturing apparatus 10 (step B9).

On the day of scheduled carry-in, the apparatus maker divides the semiconductor manufacturing apparatus 10 into the individual units 12–22, and carries the units in the clean room (step A10). At this time, the units 12–22 are carried in along the carry-in routes, which have been decided or confirmed on an individual unit basis when the apparatus substitute 50 was carried in by moving the units with the casters.

Thereafter, the units 12–22 are combined with each other at the apparatus installation position 84 so as to assemble the semiconductor manufacturing apparatus 10 (step A11). Then, each caster is separated from the floor surface by adjusting each adjuster so as to fix the apparatus 10 at the apparatus installation position 84. In this case, the casters and adjusters do not move out of the support plates 82 since the positions of the casters and adjusters at the apparatus installation position 84 are confirmed were previously checked by using the apparatus substitute 50.

Figure 9:
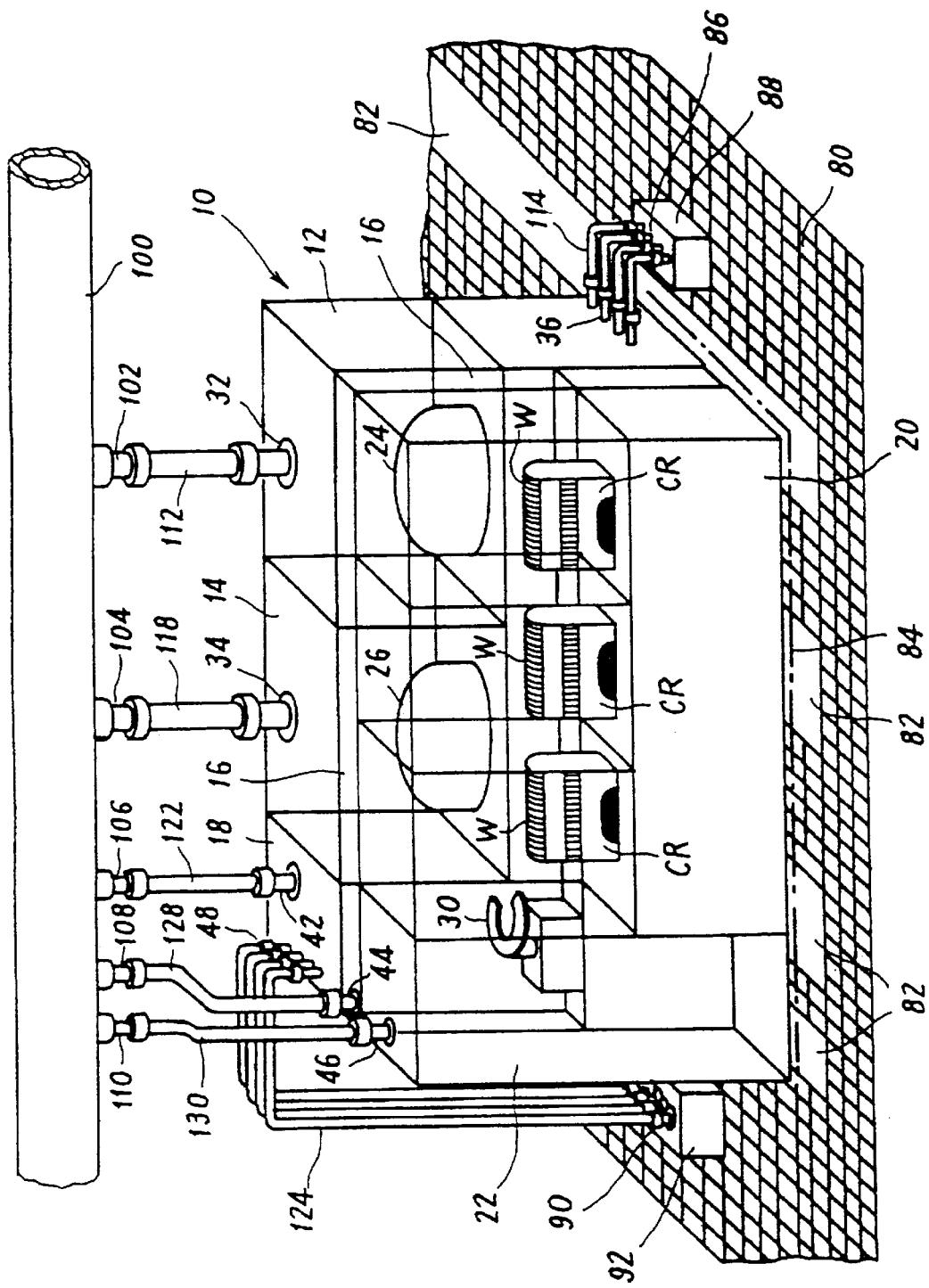
FIG. 9 is a perspective view of the semiconductor manufacturing apparatus which is carried in and installed in the clean room and to which utility lines are connected.

After the assembly of the apparatus 10, the device maker can immediately perform the utility connection (step B10). Since the necessary utility connection works have been completed based on the apparatus substitute 50 (step B8), no work is needed at this time. That is, as shown in FIG. 9, merely the joint pipes 112–130 are connected to the respective utility connection parts 32–48 of the apparatus 10. Additionally, the inspection with respect to the connected utility lines has been completed based on the apparatus substitute 50, only the inspection necessary for the apparatus 10 is performed at this time.

The apparatus 10 of which utility connection is completed can be provided with utility, and the apparatus 10 is started up by the apparatus maker (step A12). At the startup the performance of the apparatus is checked with respect to hardware and process. After the completion of the startup, the apparatus 10 is handed over to the device maker.

As mentioned above, in the present embodiment, prior to the carry-in and installation of the semiconductor manufacturing apparatus 10 in the clean room, the box-like apparatus substitute 50 provided with the tentative utility connection parts at the same position as the real utility connection parts (apparatus 10) is carried in the clean room and is installed at the position at which the apparatus 10 will be installed, and utility lines are provided up to the position at which the tentative utility connection parts of the apparatus substitute 50 are temporarily connected. By carrying and installing the apparatus 10 in the clean room after the apparatus substitute 50 is removed, the utility lines can be immediately connected to the utility connection parts of the semiconductor manufacturing apparatus without works for providing the utility lines, and the utility can be supplied to the apparatus 10. Accordingly, the standby period with respect to the connection of the utility lines after the carry-in and installation of the apparatus 10 can be eliminated, and the operation of the apparatus 10 can be started early.

In the above-mentioned embodiment, the apparatus substitute 50 is constituted by the boxes 52–60 each of which has the same length, width and height with the respective one of the units of the apparatus 10. Since the general apparatus unit has a box-like housing structure, the boxes having the same three-dimensional sizes with the units are suitable substitutional structures for deciding or checking the optimum carry-in route and for performing accurate utility connection works by checking the position and orientation of each utility connection part. However, substitutional structures other than the box such as a substitute of a bent or a frame structure can be used. Additionally, any substitute can be used if the positions and orientations of the tentative utility connection parts are the same as that of the corresponding normal (apparatus) utility connection parts when the apparatus substitute is located at the apparatus installation position, and the size of the substitute may be different from the size of the apparatus.

It should be noted that a plurality of semiconductor manufacturing apparatuses may be installed in a clean room. In such a case, the apparatus substitute may be located at one of the apparatus installation positions so as to perform the temporary utility connection, and, thereafter, the same apparatus substitute may be moved to another apparatus installation position in the clean room so as to perform the temporary utility connection. That is, if a plurality of identical semiconductor manufacturing apparatuses are to be installed, the temporary utility connection can be performed with respect to a plurality of positions by using a single apparatus substitute by repeating the temporary utility connection at different positions (by repeating step A8 of FIG. 2) by moving the same apparatus substitute in the clean room.

A description will now be given, with reference to FIG. 10, of procedures of carry-in and installation of a semiconductor manufacturing apparatus according to a second embodiment of the present invention.

Figure 10:
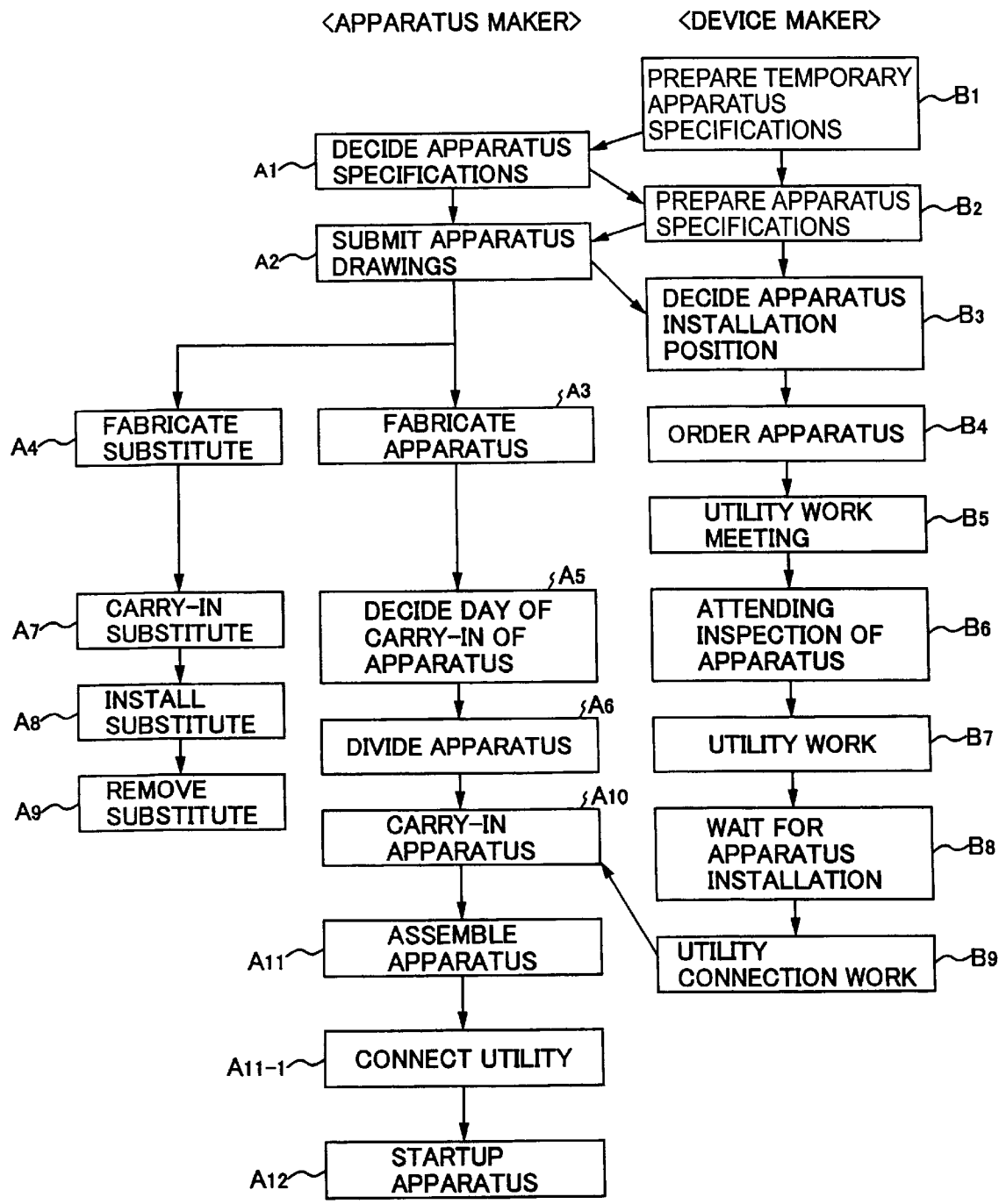
FIG. 10 s a flowchart of procedures of a method of carry-in and installation of a semiconductor manufacturing apparatus which method is according to a second embodiment of the present invention.

FIG. 10 is a flowchart of procedures of a carry-in and installation of a semiconductor manufacturing apparatus according to the second embodiment of the present invention. In FIG. 10, steps that are the same as the steps shown in FIG. 2 are give the same step numbers, and descriptions thereof will be omitted.

The carry-in and installation method according to the second embodiment of the present invention is basically the same as the above-mentioned first embodiment except for the utility connection parts of the apparatus substitute 50. That is, in the present embodiment, the utility lines are directly connected to the connection parts of the process apparatus provided in the apparatus housing. Accordingly, each unit of the apparatus substitute in the present embodiment is provided with utility connection parts of the processing apparatus provided in the semiconductor manufacturing apparatus.

The connection of the utility lines to the real processing apparatus is performed under responsibility of the apparatus maker. Accordingly, the utility connection (step B10 of FIG. 2) performed by the device maker in the above-mentioned first embodiment is eliminated, and, instead, the utility connection is performed by the apparatus maker (step A11-1 of FIG. 10). However, although the apparatus maker had to provide piping between the connection parts of the processing apparatus and the utility connection parts extended to outside the housing, such piping is not needed in the present embodiment.

Figure 11:
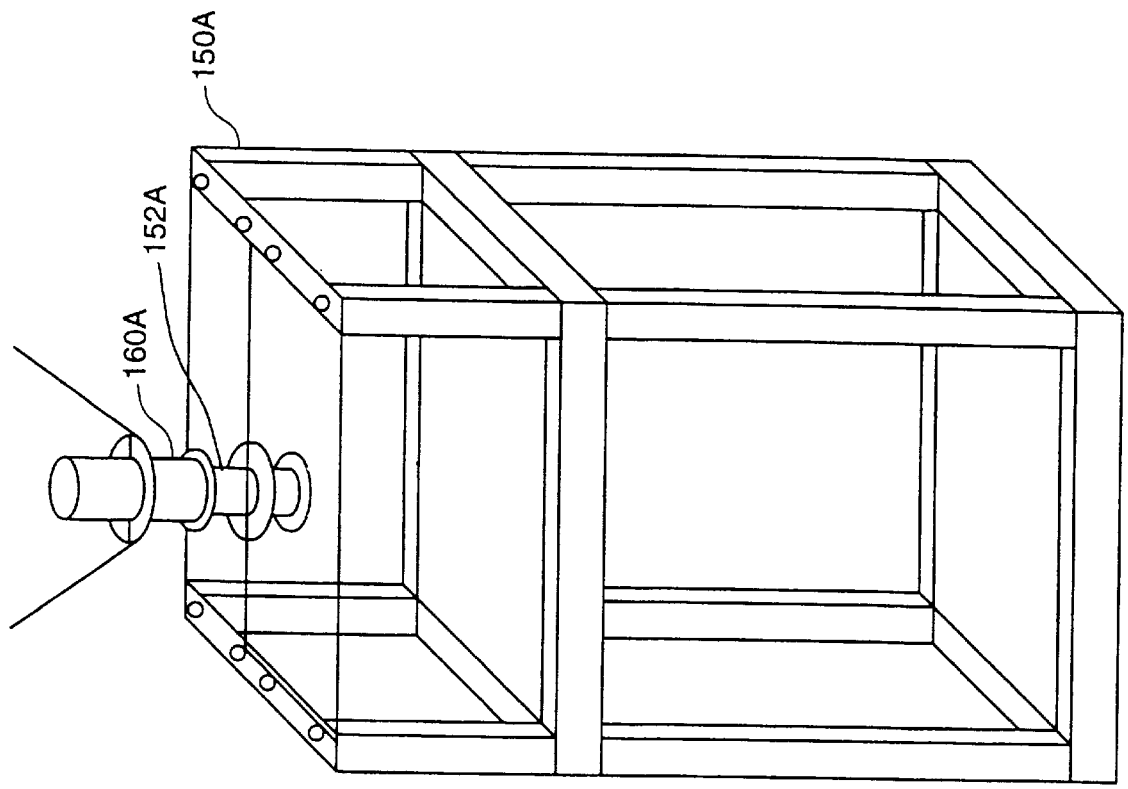
FIG. 11 is a perspective view of one of the units of an apparatus substitute used for the carry-in and installation method according to the second embodiment of the present invention.

FIG. 11 is a perspective view of one of the units of the apparatus substitute used in the carry-in and installation method according to the second embodiment of the present invention. The unit shown in FIG. 11 is a unit 150A of the apparatus substitute corresponding to one of the units of the semiconductor manufacturing apparatus, which accommodates the process apparatus requiring connection to the exhaust duct. That is, the processing apparatus of the unit of the semiconductor manufacturing apparatus corresponding to the unit 150A shown in FIG. 11 is provided with a utility connection part 152A to which an exhaust duct 160A is connected. The utility connection part 152A comprises a connector or coupling, and is provided inside a housing of the unit. The utility connection part 152A is a joint pipe, which is connected to the utility connection part of the real processing apparatus.

After the apparatus substitute is located in the clean room, the exhaust duct 160A is connected to the utility connection part 152A of the unit 150A of the apparatus substitute. Thereafter, similar to the first embodiment, an inspection is performed on the utility line including the exhaust duct. After the inspection is completed, the apparatus substitute including the unit 150A is removed from the clean room while the utility connection part 152A is remained. That is, the utility connection part 152A is separated from the unit 150A, and is remained in the clean room while being connected to the exhaust duct 160A.

Figure 12:
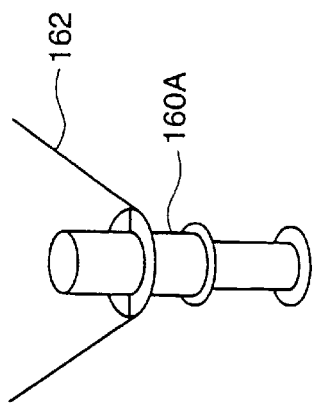
FIG. 12 is a perspective view of joint pipes in a state in which the units of the apparatus substitute shown in FIG. 11 are removed.

FIG. 12 shows a state of the utility connection part 152A after the unit 150A of the apparatus substitute is removed. As shown in FIG. 12, from the time when the real semiconductor manufacturing apparatus is installed and until the utility connection part 152A is connected to the apparatus, the exhaust duct 160A to which the utility connection part 152A is connected is supported at a predetermined position by being suspended by wires 162 from the ceiling of the clean room.

Figure 13:
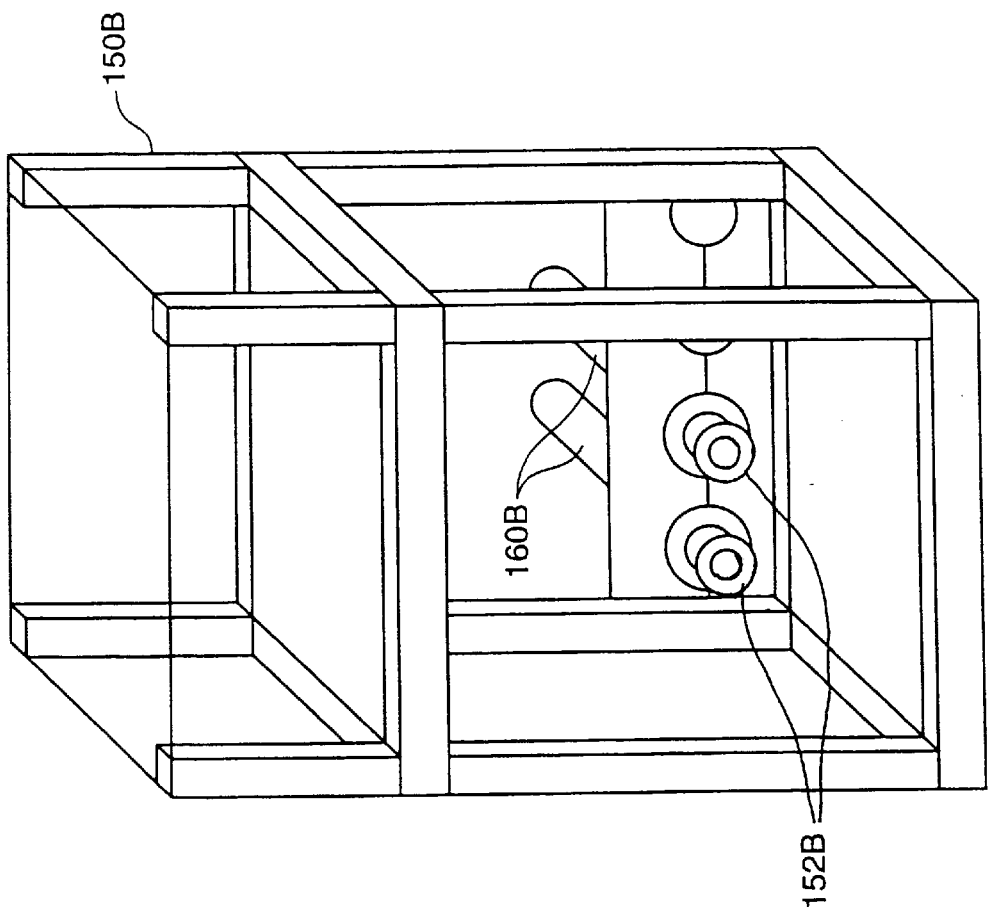
FIG. 13 is a perspective view of one of the units of the apparatus substitute used for the carry-in and installation method according to the second embodiment of the present invention.

FIG. 13 is a perspective view of one of the units of the apparatus substitute used in the carry-in and installation method according to the second embodiment of the present invention. The unit shown in FIG. 13 is a unit 150B of the apparatus substitute corresponding to one of the units of the semiconductor manufacturing apparatus, which accommodates the process apparatus requiring connection to the water piping. That is, the processing apparatus of the unit of the semiconductor manufacturing apparatus corresponding to the unit 150B shown in FIG. 13 is provided with utility connection parts 152B to which water pipes 160B are connected. Each of the utility connection parts 152B comprises a connector or coupling, and is a joint pipe, which is connected to the respective utility connection parts of the real processing apparatus.

After the apparatus substitute is located in the clean room, the water pipes 160B are connected to the respective utility connection parts 152B of the unit 150B of the apparatus substitute. Thereafter, similar to the first embodiment, an inspection is performed on the utility line including the water pipe. After the inspection is completed, the apparatus substitute including the unit 150B is removed from the clean room while the utility connection parts 152B are remained. That is, the utility connection parts 152B are separated from the unit 150B, and are remained in the clean room while being connected to the water pipes 160B.

Figure 14:
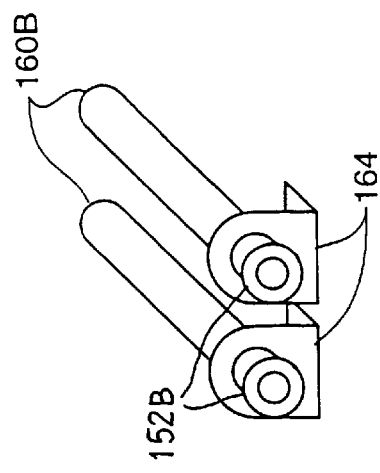
FIG. 14 is a perspective view of joint pipes in a state in which the units of the apparatus substitute shown in FIG. 13 are removed.

FIG. 14 shows a state of the utility connection parts 152B after the unit 150B of the apparatus substitute is removed. As shown in FIG. 14, from the time when the real semiconductor manufacturing apparatus is installed and until the utility connection parts 152B are connected to the apparatus, the utility connection parts 152B are supported at predetermined positions on the floor surface by supporting plates 164.

Figure 15:
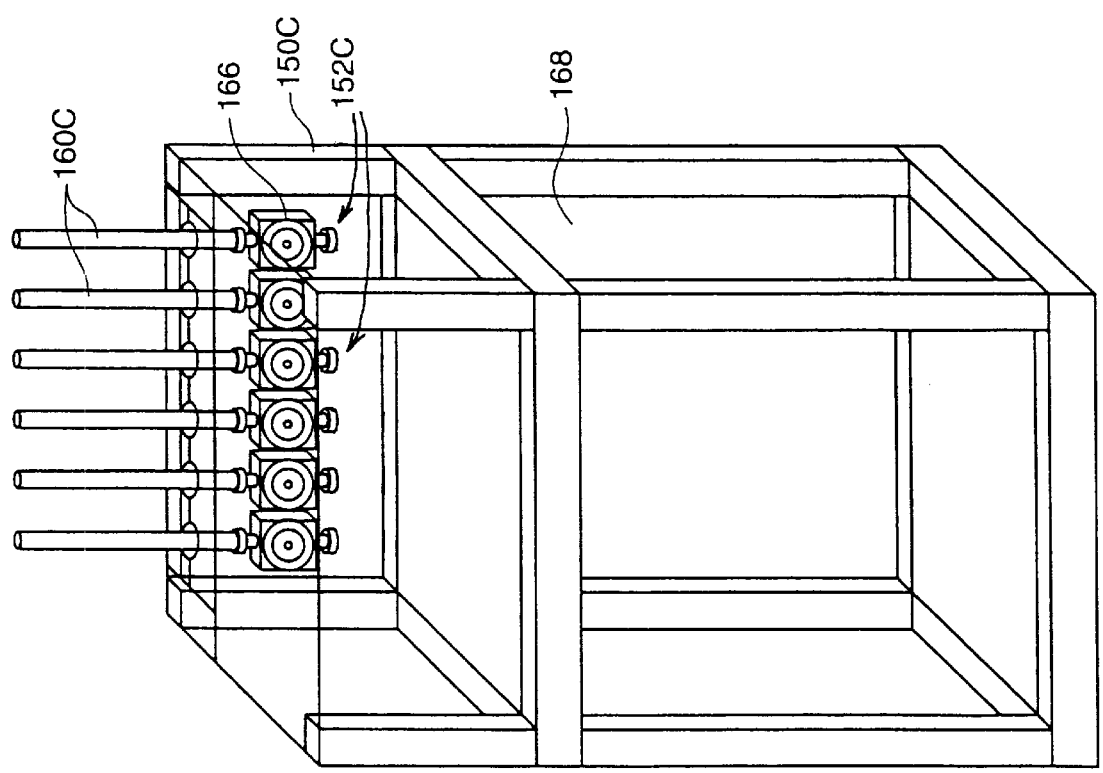
FIG. 15 is a perspective view of one of the units of the apparatus substitute used for the carry-in and installation method according to the second embodiment of the present invention.

FIG. 15 is a perspective view of one of the units of the apparatus substitute used in the carry-in and installation method according to the second embodiment of the present invention. The unit shown in FIG. 15 is a unit 150C of the apparatus substitute corresponding to one of the units of the semiconductor manufacturing apparatus, which accommodates the process apparatus requiring connection to the gas piping. That is, the processing apparatus of the unit of the semiconductor manufacturing apparatus corresponding to the unit 150C shown in FIG. 15 is provided with utility connection parts 152 to which gas pipes 160C are connected. Each of the utility connection parts 152C comprises a connector or coupling, and is provided inside a housing of the unit. The utility connection parts 152C are joint pipes, which are connected to the respective utility connection parts of the real processing apparatus. It should be noted that each of the utility connection parts is provided with a open and close valve 166, and the connection part of the open and close valve 166 serves as the connection part of the gas pipe 160C.

After the apparatus substitute is located in the clean room, the gas pipes 160C are connected to the respective utility connection parts 152C of the unit 150C of the apparatus substitute. Thereafter, similar to the first embodiment, a test is performed on the utility line including the gas pipes. After the inspection is completed, the apparatus substitute including the unit 150C is removed from the clean room while a side wall plate 168 to which the utility connection parts 152C are mounted is remained. That is, the side wall plate 168 including the utility connection parts 152C is separated from the unit 150C, and are remained in the clean room while being connected to the gas pipes 160C.

Figure 16:
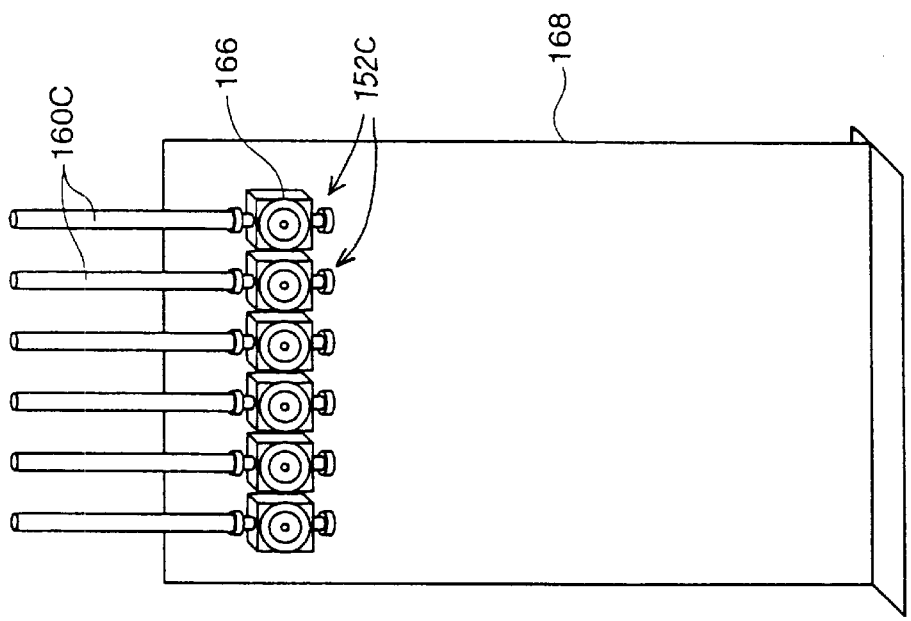
FIG. 16 is a perspective view of joint pipes in a state in which the units of the apparatus substitute shown in FIG. 15 are removed.

FIG. 16 shows a state of the utility connection parts 152C and the gas pipes 160C after the unit 150C of the apparatus substitute is removed. As shown in FIG. 16, from the time when the real semiconductor manufacturing apparatus is installed and until the utility connection parts 152C are connected to the apparatus, the utility connection parts 152C are supported at predetermined positions on the floor surface by the side wall palate 168.

It should be noted that since the gas pipes 160C shown in FIG. 16 extend upwardly from the inside of the apparatus substitute, the gas pipes 160C cannot be removed form the apparatus substitute by moving the apparatus substitute in a traverse direction when removing the apparatus substitute (unit 150C). Accordingly, in the present embodiment, the side wall plate 168 of the unit 150C is made to serve as the housing of the real semiconductor manufacturing apparatus, and the open and close valves 166 are fixed to the side wall plate 168. Then, the side wall plate 168 is separated from the unit 150C when the unit 150C is removed from the clean room and the side wall plate 168 is remained at the same position.

The side plate 168 separated form the unit 150C is fixed to the floor surface of the clean room, and the side wall plate 168 is mounted to the semiconductor manufacturing apparatus when the semiconductor manufacturing apparatus is installed. That is, a side wall of the semiconductor manufacturing apparatus corresponding to the side wall plate 168 is previously removed, and the side wall plate 168 serves as the side wall of the housing of the semiconductor manufacturing apparatus.

In the above-mentioned embodiments, a large part of the utility works is completed (step B7) in the clean room before the apparatus substitute is carried in the clean room. However, the utility works (step B7) and the utility connection works (step B8) may be executed at the same time after the apparatus substitute is carried in.

The structure of the semiconductor manufacturing apparatus in the above-mentioned embodiments is an example, and the semiconductor manufacturing apparatus can have various system structures, and an apparatus structure which does not adopt a system or an apparatus structure comprising a single unit can be used. The substrate to be processed is not limited to the semiconductor wafer, and may be an LCD substrate, a glass substrate, a CD substrate or the like.

As mentioned above, according the present invention, a period form the carry-in of the apparatus to the completion of the utility connection can be greatly reduced, and the startup or the start time of the operation of the apparatus can be hastened.

What is claimed is:

1. A method for carrying in and installing a semiconductor manufacturing apparatus in a clean room, the method comprising:

preparing an apparatus substitute having tentative utility connection parts that correspond to utility connection parts of the semiconductor manufacturing apparatus, the tentative utility connection parts being positioned at substantially the same positions as that of the utility connection parts of the semiconductor manufacturing apparatus;

carrying said apparatus substitute in the clean room and arranging said apparatus substitute at a predetermined apparatus installation position;

providing utility lines to said tentative utility connection parts of said apparatus substitute positioned at said predetermined apparatus installation position;

removing said apparatus substitute from the clean room;

carrying the semiconductor manufacturing apparatus in the clean room and installing the semiconductor manufacturing apparatus at said predetermined apparatus installation position after said apparatus substitute is removed; and connecting said utility lines to the utility connection parts of the semiconductor manufacturing apparatus.

2. The method for carrying in and installing a semiconductor manufacturing apparatus as claimed in claim 1, wherein said apparatus substitute has the same outside dimensions as the semiconductor manufacturing apparatus.

3. The method for carrying in and installing a semiconductor manufacturing apparatus as claimed in claim 2, wherein a carry-in route for carrying the semiconductor manufacturing apparatus in the clean room is determined based on a carry-in route for carrying said apparatus substitute in said clean room.

4. The method for carrying in and installing a semiconductor manufacturing apparatus as claimed in claim 3, wherein said semiconductor manufacturing apparatus comprises a plurality of units that are separately combined with each other, and the method further comprises:

separating said apparatus substitute into a plurality of units, at least a part of the plurality of units of said apparatus substitute corresponds to said plurality of units of said semiconductor manufacturing apparatus;

carrying the plurality of units of said apparatus substitute in said clean room; and assembling the plurality of units of said apparatus substitute carried in said clean room so as to restore said apparatus substitute.

5. The method for carrying in and installing a semiconductor manufacturing apparatus as claimed in one of the claims 1 to 4, wherein each of said tentative utility connection parts of said apparatus substitute is based on the same connection specifications as the respective one of said utility connection parts of said semiconductor manufacturing apparatus, and providing said utility lines includes disconnecting said utility lines after tentatively connecting said utility lines to said tentative utility connection parts.

6. The method of carrying in and installing a semiconductor manufacturing apparatus as claimed in one of claims 1 to 4, wherein said apparatus substitute has a caster and height adjusting tool which is substantially the same as a caster and height adjusting tool provided to said semiconductor manufacturing apparatus, and the method further comprises carrying and installing said semiconductor manufacturing apparatus in said clean room through a route along which said apparatus substitute is carried and installed in said clean room.

7. The method for carrying in and installing a semiconductor manufacturing apparatus as claimed in one of claims 1 to 4, wherein said clean room has positions at which a plurality of said semiconductor manufacturing apparatuses are installed, and providing said utility lines is repeated a plurality of time for each of said plurality of semiconductor manufacturing apparatuses installed.

8. A method for carrying in and installing a semiconductor manufacturing apparatus in a cleans room, the method comprising:

preparing an apparatus substitute having utility connection parts of said semiconductor manufacturing apparatus positioned at substantially the same positions as that of the utility connection parts of said semiconductor manufacturing apparatus;

carrying said apparatus substitute in said clean room and arranging said apparatus substitute at a predetermined apparatus installation position;

connecting said utility connection parts of said apparatus substitute positioned at said predetermined apparatus installation position to said utility lines;

disconnecting said utility connection parts from said apparatus substitute and removing said apparatus substitute from said clean room;

carrying said semiconductor manufacturing apparatus in said clean room and installing said semiconductor manufacturing apparatus at said predetermined apparatus installation position after said apparatus substitutes removed; and connecting said utility lines to said semiconductor manufacturing apparatus carried in said clean room.

\* \* \* \* \*